United States Patent
Yoon

(10) Patent No.: US 6,900,095 B2
(45) Date of Patent: May 31, 2005

(54) HYDROGEN BARRIER LAYER AND METHOD FOR FABRICATING SEMICONDUCTOR DEVICE HAVING THE SAME

(75) Inventor: Dong-Soo Yoon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/330,129

(22) Filed: Dec. 30, 2002

(65) Prior Publication Data

US 2003/0216028 A1 Nov. 20, 2003

(30) Foreign Application Priority Data

May 18, 2002 (KR) ......................................... 2002-27593

(51) Int. Cl.[7] ......................................... H01L 21/8242
(52) U.S. Cl. ......................................... 438/241; 438/239
(58) Field of Search ......................... 438/3, 239, 241, 438/253, 396

(56) References Cited

U.S. PATENT DOCUMENTS 6,352,898 B2 * 3/2002 Yang et al. ................. 438/298
6,365,927 B1    4/2002 Cuchiaro et al.
6,395,612 B1 *  5/2002 Amanuma ................... 438/393
6,630,702 B2 * 10/2003 Zhang et al. ................ 257/295
6,642,100 B2 * 11/2003 Yang et al. .................. 438/253

FOREIGN PATENT DOCUMENTS

JP    2002-110931    4/2002    ......... H01L/27/105
KR     990062231    7/2001    ......... H01L/27/105

* cited by examiner

*Primary Examiner*—David Nelms
*Assistant Examiner*—Quoc Hoang
(74) *Attorney, Agent, or Firm*—Mayer, Brown, Rowe & Maw LLP

(57) ABSTRACT

The present invention provides a hydrogen barrier layer able to prevent diffusions of hydrogen into a capacitor and a method for fabricating a semiconductor device having the same. The inventive method includes the steps of: forming a capacitor on an upper portion of a substrate providing a transistor; forming a first hydrogen barrier layer covering the capacitor, the first hydrogen barrier layer containing Al and Ti; forming a metal line connecting the capacitor to the transistor; forming a second hydrogen barrier layer containing Al and Ti on the metal line; and forming a protection layer on the second hydrogen barrier layer.

10 Claims, 2 Drawing Sheets

Figure 1:
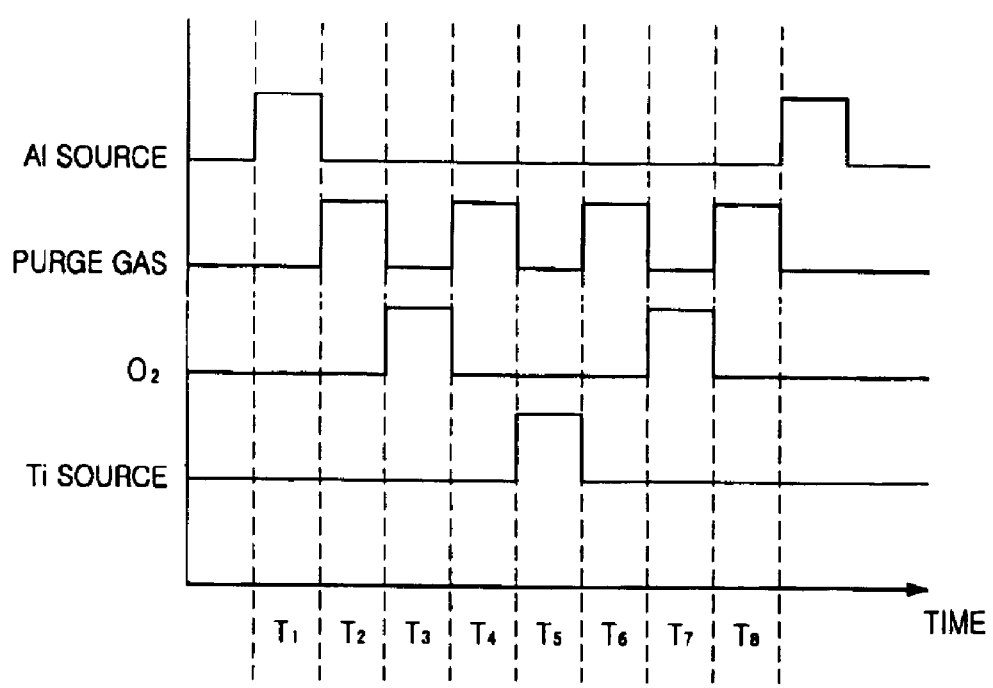

HYDROGEN BARRIER LAYER AND METHOD FOR FABRICATING SEMICONDUCTOR DEVICE HAVING THE SAME

FIELD OF THE INVENTION

The present invention relates to a method for fabricating a semiconductor device; and, more particularly, to a method for fabricating a semiconductor device having a hydrogen barrier layer.

DESCRIPTION OF RELATED ARTS

In a capacitor of a semiconductive memory device such as a dynamic random access memory (DRAM) device and a ferroelectric random access memory (FeRAM) device, dielectric characteristics of a dielectric material are degraded during an integration process of a semiconductive memory device performed after a process for forming a capacitor.

The problem that the dielectric layer of the capacitor in the semiconductive memory device is degraded will be described in more detail. In respect of fabricating a semiconductive memory device, an inter-layer dielectric layer (ILD) formation process, an inter-metal line dielectric layer (IMD) formation process and a passivation layer formation process are subsequently proceeded after forming the capacitor.

However, impurities, particularly, hydrogen that can degrade the dielectric layer of the capacitor can be induced while proceeding the above processes. The induced hydrogen can be directly diffused into the dielectric layer of the capacitor during the proceeding of the above process or can be indirectly diffused into the dielectric layer of the capacitor by being absorbed in an inter-layer dielectric layer, an inter-metal line dielectric layer or a passivation layer. As a result of this direct or indirect diffusion of the induced hydrogen, dielectric characteristics of the dielectric layer in the capacitor are degraded.

For instance, after fabricating a capacitor in a FeRAM device, a process for forming an inter-layer dielectric layer constructed with a silicon oxide layer by using $SiH_4$ gas and $O_2$ gas as a reaction gas is proceeded, and then, hydrogen is induced as a by-product after the $SiH_4$ gas and the $O_2$ gas react with each other. The induced hydrogen is directly diffused into the dielectric layer of the capacitor, resulting in degradation of the dielectric layer of the capacitor. The induced hydrogen is also absorbed into the inter-layer dielectric layer, resulting gradual degradation of the dielectric layer of the capacitor. Therefore, there further results in a loss of dielectric characteristics of the dielectric layer of the capacitor.

The problem in degradation of the dielectric layer of the capacitor due to impurities such as hydrogen during the integration process of the semiconductive memory device occurs not only during the ILD process for forming an inter-layer dielectric layer, but also during the IMD process for forming an inter-metal line dielectric layer containing a high quantity of hydrogen and during the passivation formation process.

As described the above, a source gas including hydrogen and plasma are used in the ILD process proceeded after forming the capacitor in accordance with a prior art. Hence, hydrogen atoms, ions and molecules are easily produced and diffused into a dielectric material, thereby inducing a hydrogen shock that causes dielectric characteristics of the dielectric layer to be degraded.

To solve the above problem, a dielectric layer constructed with $Al_2O_3$ and $TiO_2$ is recently used as a hydrogen barrier layer. However, this dielectric layer is not able to completely block the hydrogen diffusion.

SUMMARY OF THE INVENTION

It is, therefore, an object of the present invention to provide a hydrogen barrier layer capable of preventing hydrogen from diffusing into a capacitor.

In accordance with an aspect of the present invention, there is provided a semiconductor device comprising a hydrogen barrier layer for preventing hydrogen from diffusing into a capacitor, wherein the hydrogen barrier layer includes titanium (Ti) and oxygen ($O_2$) to aluminum (Al).

In accordance with another aspect of the present invention, there is provided a method for forming a hydrogen barrier layer, comprising the steps of: loading a substrate to a deposition chamber; and supplying Al and Ti sources and a reaction gas to the deposition chamber so to deposit a complex oxide material includes Ti and $O_2$ to Al on the substrate.

In accordance with further another aspect of the present invention, there is provided a method for fabricating a semiconductor device having a hydrogen barrier layer, comprising the steps of: forming a capacitor on a substrate including a transistor; and forming a first hydrogen barrier layer covering the capacitor, the first hydrogen barrier layer containing Al and Ti.

BRIEF DESCRIPTION OF THE DRAWING(S)

Figure 2:
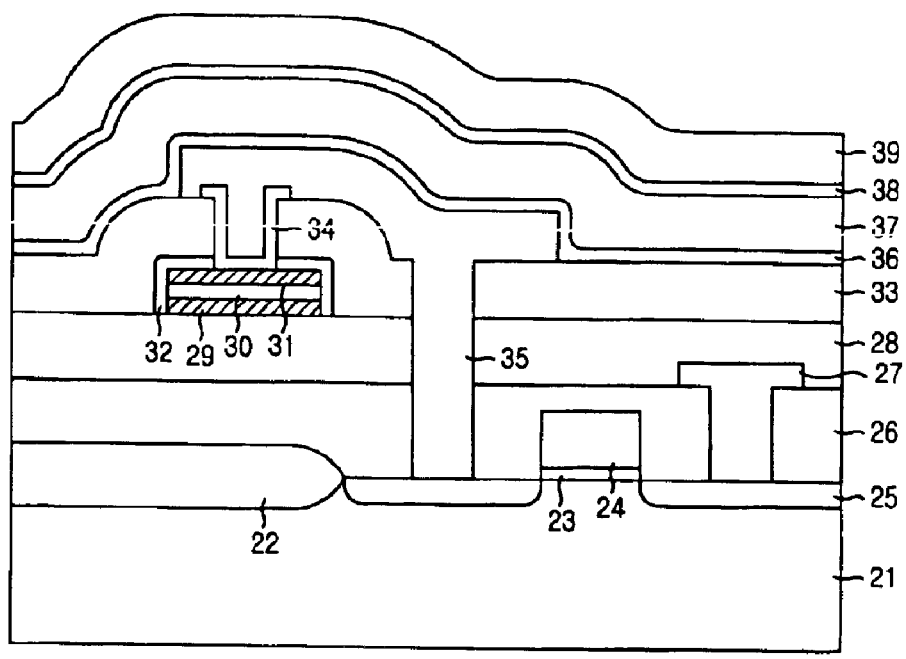

The above and other objects and features of the present invention will become apparent from the following description of the preferred embodiments given in conjunction with the accompanying drawings, in which:

FIG. 1 is a timing diagram showing of gas supply in accordance with a preferred embodiment of the present invention; and FIG. 2 is a cross-sectional view illustrating a ferroelectric random access memory (FeRAM) device to which FIG. 1 is applied.

DETAILED DESCRIPTION OF THE INVENTION

The present invention employs AlTiO of which density is theoretically higher than $Al_2O_3$ and $TiO_2$ typically used as a hydrogen barrier layer in a prior art. The AlTiO is a complex oxide material provided by mixing an aluminum oxide and a titanium oxide. The AlTiO has a complex reticulation structure established through a very strong chemical bonding due to the aluminum oxide contained in the AlTiO.

Since the complex oxide material including the aluminum oxide such as AlTiO has a high density and a complex reticulation structure, it is possible to effectively prevent hydrogen diffusions.

The following preferred embodiment of the present invention will explain an atomic layer deposition (ALD) technique and a chemical vapor deposition (CVD) technique as a method for forming the complex oxide material containing the aluminum oxide.

FIG. 1 is a diagram illustrating a functional timing of each element used in the ALD technique for depositing AlTiO, which is a complex oxide material provided by mixing an aluminum oxide and a titanium oxide in accordance with a preferred embodiment of the present invention.

Generally, the ALD technique is a deposition technique for depositing sequentially a number of single atomic layers on a substrate with a specific scheme wherein reaction sources are sequentially added to a chamber and removed thereafter.

This ALD technique uses a chemical reaction for the deposition as like the CVD technique. However, the ALD technique is different from the CVD technique since each employed gas is supplied in a pulse type, i.e., each gas is sequentially supplied at a specifically designated time instead of mixing them all at once in the chamber.

For instance, in case of using A and B gases, the gas A is firstly added. At this time, molecules of the gas A are chemically absorbed. After the absorption, the remaining gas A in the chamber is purged by using inert gas such as argon or nitrogen. Afterwards, if the gas B is only added, a chemical reaction between the gas A and the gas B occurs only at a surface on which molecules of the gas A are chemically absorbed, thereby depositing a thin film of a single atomic layer. Because of this characteristic chemical reaction, it is possible to obtain about 100% of step coverage on a surface having any types of morphology. After the chemical reaction between the A and B gases, the remaining gas B in the chamber and byproducts from the chemical reaction are purged. The atomic layer deposition is repeated by adding the gas A or the gas B, thereby controlling a thickness of the thin film in a unit of the atomic layer.

In other words, the thickness of the thin film based on the ALD technique is closely related to the number of repeated ALD process.

With use of the above-described ALD technique, $AlX_3$ and either $TiX_4$ or $TiX_2$ are used as a source material for depositing an AlTiO layer made of Al, Ti and O. Herein, the AlTiO layer acts as a hydrogen barrier layer.

First, in the $AlX_3$, which is a source material for Al, X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

In the $TiX_4$, which is a source material for Ti, X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

Also, such gas as $O_2$, $N_2O$, $NH_3$, $H_2O$, $H_2O_2$, ROH, RCOOH, diol having about 2 to 10 carbon branches or a mixed gas of the above gases can be used as a reaction gas for reacting the source materials. Herein, R is any one substrate selected from a group consisting of H, alkyl having about 1 to 10 carbon branches, alkenyl having about 2 to 10 carbon branches, alkoxy having about 1 to 8. carbon branches, aryl having about 6 to 12 carbon braches and derivatives of the above listed substrates added with one of halogen elements.

Among the above provided substrates, the $AlX_3$ and either $TiX_4$ or $TiX_2$ are used as the source material. The following will describe a case of using $O_2$ as the reaction gas.

Firstly, $O_2$ reacts with each of the Al source and the Ti source as like a reaction 1 provided in below.

$$AlX_3 + O_2 \rightarrow AlO_x + 3XO_2 (\uparrow)$$

$$TiX_4 + O_2 \rightarrow TiO_x + 4X_nO_2 (\uparrow)$$

$$TiX_2 + O_2 \rightarrow TiO_x + 2XO_2 (\uparrow) \qquad \text{Reaction 1}$$

From this reaction, $AlO_x$ and $TiO_x$ are produced. Also, $XO_2$ that is strongly volatile is a byproduct of the reaction. Since the $XO_2$ is strongly volatile, it is easily purged into vacuum.

Referring to the reaction 1, the ALD technique will be described in more detail. First, a substrate where an AlTiO layer will be deposited is loaded in a deposition chamber. From an Al source supplier, $AlX_3$, which is a source of Al is supplied to the deposition chamber through an Al supplying pipe for about $T_1$ times. Herein, the time $T_1$ is sufficient to form an atomic layer through a chemical absorption of the $AlX_3$ onto the substrate.

A process recipe for about $T_1$ times is the following: the $AlX_3$ is supplied inside of the deposition chamber with a flow quantity ranging from about 3 sccm to about 150 sccm for about 0.1 second to about 1 second by maintaining a pressure in a range between about 1 torr to about 10 torr. The substrate on which the $AlX_3$ is chemically absorbed is maintained with a temperature ranging from about 100° C. to about 900° C.

After supplying the $AlX_3$ for about $T_1$ times, a value connected to the Al source supplier is closed. Subsequently, a valve connected to a purge gas supplier is opened, and then, a purge gas is supplied to the deposition chamber for about $T_2$ times so as to purge the $AlX_3$ remaining in the deposition chamber through an exhaust gas pipe.

At this time, the time $T_2$ is a time sufficient for purging the non-reacted $AlX_3$. That is, it is preferable for the time $T_2$ to be in a range between about 0.1 second and about 10 seconds. Also, the purge gas uses $N_2$, He, Ne, Ar, $H_2$ or a mixed gas of the above gases and is supplied with a flow quantity ranging from about 100 sccm to about 3000 sccm.

In addition to the purge gas, it is also possible to purge the non-reacted $AlX_3$ through a pumping.

After purging the unreacted $AlX_3$ for about $T_2$ times, $O_2$ is supplied from a reaction gas supplier to the reaction chamber through a reaction gas supplying pipe for about $T_3$ times. Herein, the time $T_3$ is a sufficient time for the $O_2$ to react with the $AlX_3$ chemically absorbed onto the substrate.

Hence, the $O_2$, which is the reaction gas, reacts with the $AlX_3$ chemically absorbed onto the substrate for the $T_3$ times in accordance with the reaction 1 so as to form a $AlO_x$ thin film on the substrate.

A process recipe for about $T_3$ times is the following: the reaction gas, $O_2$ is supplied to the deposition chamber maintained with a pressure ranging from about 1 torr to about 10 torr for about 0.1 second to about 1 second. Herein, the $O_2$ gas is supplied with a flow quantity ranging from about 100 sccm to about 3000 sccm. Also, the substrate on which the $AlX_3$ is chemically absorbed is maintained with a temperature ranging from about 100° C. to about 900° C.

After supplying the $O_2$ for the $T_3$ times, a valve connected to the reaction gas supplying pipe is closed. Then, a value connected to a purge gas supplying pipe is opened to supply a purge gas from a purge gas supplier to the deposition chamber for about $T_4$ times, thereby purging byproducts of the reaction between the $AlX_3$ and the $O_2$ through the exhaust gas pipe.

At this time, the $T_4$ time is a time sufficient for purging the byproducts of the reaction. Preferably, it is in a range between about 0.1 second and about 10 seconds. Such gas as $N_2$, He, Ne, Ar, $H_2$ or a mixed gas of the above listed gases is used as a purge gas, which is supplied with a flow quantity ranging from about 100 sccm to about 3000 sccm.

Next, after the purging, a Ti source, $TiX_4$, is supplied from a Ti source supplier to the deposition chamber through a Ti source supplying pipe for about $T_5$ times. Herein, the time $T_5$ is a sufficient time for depositing an atomic layer through a chemical absorption of the $TiX_4$ onto the $AlO_x$.

A process recipe for about $T_5$ times is the following: the $TiX_4$ is supplied to the deposition chamber maintained with a pressure ranging from about 1 torr to about 10 torr for about 0.1 second to about 1 second. At this time, the $TiX_4$ has a flow quantity ranging from about 3 sccm to about 150 sccm. Also, the substrate is maintained with a temperature in a range between about 100° C. to about 900° C. while the $TiX_4$ is chemically absorbed onto the $AlO_x$.

After supplying the $TiX_4$ for about $T_5$ times, a value connected to the Ti source supplying pipe is closed. Then, a value connected to the purge gas supplying pipe is opened, and the purge gas is subsequently supplied from the purge gas supplier to the deposition chamber for about $T_6$ times so to purge the $Tix_4$ remaining in the deposition chamber through the exhaust gas pipe instead of chemically absorbing the $TiX_4$ onto the $AlO_x$.

At this time, the time $T_6$ is a time sufficient for purging the non-reacted $TiX_4$. Preferably, it is in a range from about 0.1 second to about 10 seconds. Also, the purge gas uses such gas as $N_2$, $H_2$, Ne, Ar, $H_2$ or a mixed gas of the above listed gas. Furthermore, the purge gas is supplied with a flow quantity ranging from about 100 sccm to about 3000 sccm.

In addition to the purge gas, it is still possible to purge the $TiX_4$ through a pumping.

After purging the unreacted $TiX_4$ for about $T_6$ times, $O_2$ is supplied from the reaction gas supplier to the deposition chamber through the reaction gas supplying pipe for about $T_7$ times. Herein, the time $T_7$ is a sufficient time for $NH_3$ to react with the $Tix_4$ chemically absorbed onto the $AlO_x$.

Therefore, the reaction gas, $O_2$, reacts with the $TiX_4$ for about $T_7$ times in accordance with the provided reaction 1 so to form a thin film of $TiO_x$ on the $AlO_x$.

A process recipe for about $T_7$ times is the following: the reaction gas, $O_2$, is supplied with a flow quantity ranging from about 100 sccm to about 3000 sccm to the deposition chamber for about 0.1 second to about 1 second. Herein, the reaction chamber is maintained with a pressure ranging from about 1 torr to about 10 torr, and a temperature of the substrate is maintained in a range between about 100° C. to about 900° C.

After supplying the $O_2$ for about $T_7$ times, a value connected to the reaction gas supplying pipe is closed. Subsequently, a valve connected to the purge gas supplying pipe is opened, and a purge gas is supplied from the purge gas supplier to the deposition chamber for about $T_8$ times so to purge byproducts of the reaction between the $TiX_4$ and the $O_2$.

At this time, the time $T_8$ is a time sufficient for purging the byproducts. Preferably, it is in a range from about 0.1 second to about 10 seconds. Such gas as $N_2$, He, Ne, Ar, $H_2$ or a mixed gas of the above listed gases is used as the purge gas supplied with a flow quantity ranging from about 100 sccm to about 3000 sccm.

As described in the above, one cycle of depositing the AlTiO with a consistent thickness includes the Al source supplying step $T_1$, the purge gas supplying step $T_2$, the reaction gas supplying step $T_3$, the purge gas supplying step $T_4$, the Ti source supplying step $T_5$, the purge gas supplying step $T_6$, the reaction gas supplying step $T_7$ and the purge gas supplying step $T_8$.

In case of repeating this cycle, the thickness of the AlTiO increases in proportion to the number of repeated cycles.

Therefore, it is possible to deposit the AlTiO to a set thickness by repeating the cycle. At this time, a thickness of the AlTiO deposited per cycle is determined by a supplying time and flow quantities of the $AlX_3$, $TiX_4$, a reaction gas and a purge gas supplied to the deposition chamber.

In addition to the above-mentioned one cycle for depositing the atomic layer of the AlTiO, a plasma enhanced ALD technique of which one cycle includes the Al source supplying step $T_1$, the purge gas supplying step $T_2$, the reaction gas supplying step $T_3$, the purge gas supplying step $T_4$, the plasma process step, the Ti source supplying step $T_5$, the purge gas supplying step $T_6$, the reaction gas supplying step $T_7$, the purge gas supplying step $T_8$ and the plasma process step. Herein, such gas as $NH_3$, $N_2$, $O_2$, $N_2O$, $H_2O$ or a mixed gas of the above listed gases is used at the plasma process step.

Also, it is further possible to use one cycle including the reaction gas supplying step, the purge gas supplying step, the Al source supplying step $T_1$, the purge gas supplying step $T_2$, the reaction gas supplying step $T_3$, the purge gas supplying step $T_4$, the reaction gas supplying step, the purge gas supplying step, the Ti source supplying step $T_5$, the purge gas supplying step $T_6$, the reaction gas supplying step $T_7$ and the purge gas supplying step $T_8$ or use one cycle including the reaction gas supplying step, the purge gas supplying step, the Al source supplying step Ti, the purge gas supplying step $T_2$, the reaction gas supplying step $T_3$, the purge gas supplying step $T_4$, the reaction gas supplying step, the purge gas supplying step, the plasma process step, the Ti source supplying step $T_5$, the purge gas supplying step $T_6$, the reaction gas supplying step $T_7$, the purge gas supplying step $T_8$ and the plasma process step.

It is also possible to employ the CVD technique for depositing the AlTiO layer in addition to the ALD technique. In this case, $AlX_3$ and either $TiX_4$ or $TiX_2$ are also used as source materials for depositing a hydrogen barrier layer of the AlTiO mixed with Al, Ti and $O_2$.

First, in the $AlX_3$, which is a source material for Al, X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

In the $TiX_4$, which is a source material for Ti, X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

Also, such gas as $O_2$, $N_2O$, $NH_3$, $H_2O$, $H_2O_2$, ROH, RCOOH, diol having about 2 to 10 carbon branches or a mixed gas of the above gases can be used as a reaction gas for reacting the source materials. Herein, R is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon braches and derivatives of the above listed substrates added with one of halogen elements.

FIG. 2 is a cross-sectional view showing a ferroelectric random access memory (FeRAM) device using an AlTiO layer as a hydrogen barrier layer in accordance with a preferred embodiment of the present invention.

Referring to FIG. 2, a field oxide layer 22 is formed on a predetermined portion of a substrate 21 so to define an active area. Subsequently, a gate oxide layer 23 and a word line 24 are formed on the active area of the substrate 21. Afterwards, a source/drain 25 is formed by ion implanting impurities onto certain portions of the substrate 21 located at both lateral sides of the word line 24.

Next, a first inter-layer insulating layer 26 is formed on the substrate 21 including the word line 24, and the first inter-layer insulating layer 26 is then selectively etched to form a bit line contact hole (not shown) exposing one side of the source/drain 25. Continuous to the formation of the bit line contact hole, a bit line 27 contacting to the one side of the source/drain 25 through the bit line contact hole is formed.

Afterwards, a second inter-layer insulating layer 28 is formed on the above entire structure including the bit line 27. On a predetermined portion of the second inter-layer insulating layer 28, a lower electrode 29, a ferroelectric layer 30 and an upper electrode 31 are sequentially stacked so to form a stacked-type capacitor.

Meanwhile, in an etching process for forming the capacitor, an etch protection layer (not shown) for protecting the second inter-layer insulating layer 28 from being etched is formed on the second inter-layer insulating layer 28. Also, an adhesion layer (not shown) for preventing a lifting of the lower electrode 29 can be formed on between the etch protection layer and the lower electrode 29.

Next, an atomic layer deposition (ALD) technique or a chemical vapor deposition (CVD) technique is used to deposit a first AlTiO layer 32 on the entire structure including the capacitor, and the first AlTiO layer 32 is then patterned to form the first AlTiO layer 32 covering only the capacitor. After the first AlTiO layer formation, a third inter-layer insulating layer 33 and the first AlTiO layer 32 are selectively etched so as to form a contact hole exposing the upper electrode 31 of the capacitor. Also, the third inter-layer insulating layer 33, the second inter-layer insulating layer 28 and the first inter-layer insulating layer 26 are etched to form simultaneously or sequentially another contact hole exposing the source/drain 25.

Next, a diffusion barrier layer 34 contacting solely to the upper electrode 31 is formed, and a first metal line 35 electrically connecting the upper electrode 31 of the capacitor to the source/drain 25 of a transistor is formed. Herein, the first metal line 35 connecting the capacitor to the transistor is called local line.

A second AlTiO layer 36 is deposited on the above entire structure including the first metal line 35 through an ALD or a CVD technique, and an inter-metal insulating layer 37 and a second metal line (not shown) are formed thereon. Then, a third AlTiO 38 layer covering the above structure including the second metal line is formed. Subsequently, a protection layer 39 is formed thereon.

Meanwhile, each of the AlTiO layers 32, 36 and 38 is deposited to a thickness ranging from about 200 Å to about 1000 Å, and this thickness is sufficient for preventing diffusions of hydrogen.

In accordance with FIG. 2, it is possible to prevent hydrogen, generated when forming the subsequent inter-layer insulating layer and the protection layer, from diffusing into the capacitor due to the formation of the AlTiO layer covering the capacitor. Furthermore, the effect on the prevention of the hydrogen diffusion is enhanced because another AlTio layers are additionally formed even after completing the formations of the first and the second metal lines.

After forming the AlTiO layer, the AlTiO layer is densified, and a reforming process filling oxygen onto a surface of the AlTiO layer is proceeded to reinforce oxide resisting characteristics of the AlTiO layer as a hydrogen barrier layer.

There are many various methods for densifying the AlTiO layer and the oxygen filling.

As a first example, the AlTiO layer is loaded to a chamber for a thermal process and proceeded with a rapid thermal process (RTP). Herein, the RTP is carried out at a temperature ranging from about 100° C. to about 650° C. in an atmosphere of $O_2$, a mixture of Ar and $O_2$ or a mixture of $N_2$ and $O_2$ for about 1 minute to about 5 minutes. At this time, each flow quantity of $O_2$, Ar and $N_2$ is changed while proceeding the RTP.

As a second example, $O_2$ is first added to the chamber and ionized through an electric field provided from a substrate. Then, the ionized oxygen is accelerated towards the AlTiO layer so to densify the AlTiO layer as simultaneously as to fill the oxygen onto a surface of the AlTiO layer.

As a third example, Ar is added to the chamber and ionized. Then, the ionized Ar is accelerated towards the AlTiO layer for inducing collisions of the ionized Ar to the AlTiO layer. As a result of the collisions, the AlTiO layer is densified, and then, ionized oxygen is added thereto as to form a uniform oxide layer on the AlTiO layer.

As a fifth example, $O_2$ and $N_2$ are simultaneously added to the chamber and ionized thereafter. Then, the ionized nitrogen and oxygen are collided with the AlTiO layer so to densify the AlTiO layer. After the densification, the ionized oxygen is used to form a uniform oxide layer on the AlTiO layer.

As a sixth example, a thermal process is performed with use of $NH_4$ in the chamber so as to densify the AlTiO layer. Afterwards, oxygen is additionally added and ionized. Then, the ionized oxygen is used to form a uniform oxide layer on the AlTiO layer.

As a seventh example, $NH_4$ plasma and $O_2$ plasma are added to the chamber and used to form a uniform oxide layer on the AlTiO layer.

As an eighth example, a thermal process is performed in the chamber by using ultraviolet (UV) rays so as to densify the AlTio layer as simultaneously as to form a uniform oxide layer on the AlTiO layer.

It is also possible to apply the reforming process to the AlTiO layer through combinations of the second to the eighth examples. All the processes embodied from the second to the eighth examples are proceeded at a temperature ranging from about 100° C. to about 650° C. for about 1 minute to about 5 minutes.

Although it is not illustrated in FIG. 2, the AlTiO layer can be used as a hydrogen barrier layer even in a capacitor of a dynamic random access memory (DRAM) device particularly using BST as a dielectric layer.

The present provides an advantage that it is possible to prevent hydrogen, generated during the deposition processes for the inter-layer insulating layer and the protection layer after forming the capacitor, from diffusing into the capacitor. As a result of this advantage, it is further possible to prevent degradation of electric characteristics of a device and simultaneously to increase yields of semiconductor devices. That is, it is possible to prevent hydrogen from diffusing into the capacitor by forming the hydrogen barrier layer covering the capacitor before forming the inter-layer insulating layer. Therefore, it is much easier to develop a semiconductor device, and those processes subsequent to the meal line formation process are identically used as of the processes used for fabricating a DRAM device. Accordingly, there is an economical advantage since it is not necessary to perform additional processes for forming a FeRAM device.

While the present invention has been described with respect to certain preferred embodiments, it will be apparent to those skilled in the art that various changes and modifications may be made without departing from the scope of the invention as defined in the following claims.

What is claimed is:

1. A method for forming a hydrogen barrier layer, comprising the steps of:
    loading a substrate to a deposition chamber; and
    supplying Al and Ti sources and a reaction gas to the deposition chamber to deposit a complex oxide material including Ti and $O_2$ to Al on the substrate, wherein the Al source is $AlX_3$, where X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

2. The method as recited in claim 1, wherein the reaction gas uses such gas as $O_2$, $N_2O$, $NH_3$, $H_2O$, $H_2O_2$, ROH, RCOOH, diol having about 2 to 10 carbon branches or a mixed gas of the above gases, and the R is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches and derivatives of the above listed substrates added with one of halogen elements.

3. The method as recited in claim 1, wherein the complex oxide material is formed to a thickness ranging from about 200 Å to about 1000 Å at a temperature ranging from about 100° C. to about 900° C.

4. A method for forming a hydrogen barrier layer, comprising the steps of:
    loading a substrate to a deposition chamber; and
    supplying Al and Ti sources and a reaction gas to the deposition chamber to deposit a complex oxide material including Ti and $O_2$ to Al on the substrate, wherein the Ti source is either $TiX_4$ or $TiX_2$, where X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienYl having about 1 to 8 carbon branches and derivatives of the above listed substrates added with one of halogen elements.

5. A method for fabricating a semiconductor device having a hydrogen barrier layer, comprising the steps of:
    forming a capacitor on a substrate including a transistor; and
    forming a first hydrogen barrier layer covering the capacitor, wherein the first hydrogen barrier layer is obtained by performing the steps of:
    loading a substrate to a deposition chamber; and
    supplying Al and Ti sources and a reaction gas to the deposition chamber to deposit a complex oxide material including Ti and $O_2$ to Al on the substrate, wherein the Al source is $AlX_3$, where X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

6. The method as recited in claim 5, wherein the step of forming the hydrogen barrier layer employs either an atomic layer deposition (ALD) technique or a chemical vapor deposition (CVD) technique.

7. The method as recited in claim 5, after forming the first hydrogen barrier layer, further comprising the steps of:
    forming a metal line connecting the capacitor to the transistor;
    forming a second hydrogen barrier layer containing Al and Ti on the metal line; and
    forming a protection layer on the second hydrogen barrier layer.

8. A method for fabricating a semiconductor device having a hydrogen barrier layer, comprising the steps of:
    forming a capacitor on a substrate including a transistor; and
    forming a first hydrogen barrier layer covering the capacitor, wherein the first hydrogen barrier layer is obtained by performing the steps of:
    loading a substrate to a deposition chamber; and
    supplying Al and Ti sources and a reaction gas to the deposition chamber to deposit a complex oxide material including Ti and $O_2$ to Al on the substrate, wherein the Ti source is either $TiX_4$ or $TiX_2$, where X is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon branches, β-diketonates, cyclopentadienyl, alkylcyclopentadienyl having about 1 to 8 carbon branches and derivatives of the above listed substrates added with one of halogen elements.

9. The method as recited in claim 8, wherein the reaction gas uses such gas as $O_2$, $N_2O$, $NH_3$, $H_2O$, $H_2O_2$, ROH, RCOOH, diol having about 2 to 10 carbon branches or a mixed gas of the above gases, and the R is any one substrate selected from a group consisting of H, alkyl having about 1 to 10 carbon branches, alkenyl having about 2 to 10 carbon branches, alkoxy having about 1 to 8 carbon branches, aryl having about 6 to 12 carbon braches and derivatives of the above listed substrates added with one of halogen elements.

10. The method as recited in claim 9, wherein the complex oxide material is formed to a thickness ranging from about 200 Å to about 1000 Å at a temperature ranging from about 100° C. to about 900° C.

* * * * *